(12) United States Patent
Stark et al.

(10) Patent No.: US 12,439,546 B2
(45) Date of Patent: Oct. 7, 2025

(54) SLOTFILLER, COMPUTER-RACK INSERTABLE COMPONENT, AND COMPUTER RACK

(71) Applicant: Delta Electronics (Thailand) Public Co., Ltd., Samutprakarn (TH)

(72) Inventors: Roland Stark, Samutprakarn (TH); Matthias Paetow, Samutprakarn (TH)

(73) Assignee: Delta Electronics (Thailand) Public Co., Ltd., Samutprakarn (TH)

( * ) Notice: Subject to any disclaimer, the term of this patent is extended or adjusted under 35 U.S.C. 154(b) by 136 days.

(21) Appl. No.: 18/184,652

(22) Filed: Mar. 15, 2023

(65) Prior Publication Data
US 2023/0320020 A1    Oct. 5, 2023

(30) Foreign Application Priority Data

Apr. 4, 2022  (EP) .................................... 22166514

(51) Int. Cl.
*H05K 7/14*  (2006.01)
*H05K 7/20*  (2006.01)

(52) U.S. Cl.
CPC ......... *H05K 7/1489* (2013.01); *H05K 7/1408* (2013.01); *H05K 7/1492* (2013.01); *H05K 7/20709* (2013.01)

(58) Field of Classification Search
CPC .. H05K 7/1489; H05K 7/1408; H05K 7/1492; H05K 7/20709; H05K 5/03; H05K 7/1485; G06F 1/183; G06F 1/184
See application file for complete search history.

(56) References Cited

U.S. PATENT DOCUMENTS

| | | | |
|---|---|---|---|
| 1,491,325 A | 4/1924 | Thomas, Jr. | |
| 5,783,777 A * | 7/1998 | Kruse | H05K 7/1461 361/801 |
| 6,480,379 B1 | 11/2002 | Dickey et al. | |
| 6,853,551 B2 | 2/2005 | Baar et al. | |
| 7,982,335 B2 * | 7/2011 | Aldag | H01R 25/142 307/11 |
| 10,750,633 B1 | 8/2020 | Gold et al. | |
| 11,283,227 B2 * | 3/2022 | Chapel | H01R 25/006 |
| 11,395,434 B2 * | 7/2022 | Chang | H05K 7/1492 |

FOREIGN PATENT DOCUMENTS

| | | |
|---|---|---|
| DE | 3538177 A1 | 4/1987 |
| JP | H0766577 A | 3/1995 |

OTHER PUBLICATIONS

Corresponding extended European search report issued on Oct. 12, 2022.

* cited by examiner

*Primary Examiner* — Imani N Hayman
*Assistant Examiner* — Hung Q Dang
(74) *Attorney, Agent, or Firm* — CKC & Partners Co., LLC

(57) ABSTRACT

The present disclosure concerns a slotfiller (1) for closing a slot (21) in a computer-rack-insertable component (20), wherein the slotfiller (1) comprises at least two finger-grippable cup elements (2), and a hinge (3) connecting the cup elements (2). Therein, the slotfiller (1) is configured to be insertable into the slot (21) by pressing of the cup elements (2) towards each other and is configured to at least partially cover an open surface area of the slot (21) by releasing of the cup elements (2) in the inserted state. The present disclosure also concerns a computer-rack-insertable component (20) and a computer rack (100), each comprising at least one slotfiller (1).

20 Claims, 5 Drawing Sheets

SLOTFILLER, COMPUTER-RACK INSERTABLE COMPONENT, AND COMPUTER RACK

CROSS-REFERENCE TO RELATED APPLICATION

This application claims priority to European Patent Application No. 22166514.4, filed on Apr. 4, 2022, which is hereby incorporated by reference in its entirety.

TECHNICAL FIELD

The present disclosure concerns a slotfiller, a computer-rack insertable component, and a computer rack.

BACKGROUND

Commonly, computer cases are known, from for instance U.S. Pat. No. 6,853,551 B2, which have multiple slots for components, for example PCI cards. Further, computer racks are known, from for instance U.S. Pat. No. 10,750,633 B1, which have multiple mounting structures for receiving computer-rack-insertable components. Such components of computer cases or computer racks commonly generate heat, which is extracted by one or more fans from electronic internal elements such as transistors of the mounted components. The extracted heat is commonly transported, via an air flow of the fans, from a cool side, which is an area near or in air-flow direction before areas in which the heat is generated, to a hot side, which is an area to which the generated heat is transported. This air flow is commonly linear from a front of the computer rack to the back of the computer rack, where the heat is then ejected to the outside. When a computer-rack-insertable component is missing from the computer case or the computer rack, the slot for this component is left open. Thereby, since the front side (or cool side) is not closed off, air can eject out of this open slot away from the hot side and be sucked in or re-circulated by the fans of other components near the open slot. Thus, hot air is re-circulated, which can deteriorate a cooling efficiency of the components and even lead to failure or damage thereof. As shown in U.S. Pat. No. 6,853,551 B2, unused PCI slots are commonly closed off via metal brackets, which are mounted via screws to the frame of the computer case. The removal or addition of such a metal bracket is, however, highly time-consuming and finicky. Further, due to their sharp metal composition, they can cause damage to components when dropped or hastily installed.

SUMMARY

It is an object of the present disclosure to provide a slotfiller for closing a slot in a computer-rack-insertable component which can overcome these disadvantages. In particular, it is an object of the present disclosure to provide a slotfiller which can be quickly and easily inserted into a computer-rack-insertable component, is easy and inexpensive to manufacture, and which does not damage components, all while suitably closing off an open slot of the computer-rack-insertable component when inserted therein.

The solution of these objects is achieved by the independent claims. The dependent claims contain advantageous embodiments of the present disclosure.

In particular, the solution of these objects is achieved by a slotfiller for closing a slot in a computer-rack-insertable component. The slotfiller comprises at least two finger-grippable cup elements and a hinge connecting the two cup elements. Therein, the slotfiller is configured to be insertable into the slot by pressing of the cup elements towards each other. Further, the slotfiller is configured to at least partially cover an open surface area of the slot by releasing the of the cup elements in the inserted state.

Preferably, the slotfiller is not fully insertable into the slot when the cup elements are not pressed towards each other. Further preferably, the slotfiller completely covers the open surface area of the open slot once releasing or relieving the pressing force on the cup elements.

Preferably, the slotfiller comprises two or more cup elements. Further preferably, the slotfiller comprises three or more, four or more or five cup elements. Preferably, the slotfiller comprises at most five cup elements, for instance one for each finger of one hand. Most preferably, the slotfiller comprises exactly two cup elements.

Further advantageously, the cup elements are only connected to one another via the hinge. In other words, the cup elements are preferably not directly connected to one another, but instead are each connected, especially each directly connected, to the hinge.

Preferably, the cup elements are configured to each at least partially accommodate at least one finger of a user. Thereby, the user can insert one or more of his fingers into each of the cup elements and easily press these towards each other.

Advantageously, the cup elements each comprise one open end for receiving the finger(s) of the user and one closed end against which the inserted finger of the user abuts.

In one advantageous embodiment, the hinge connects the open ends of the cup elements. In other words, the cup elements of the slotfiller are connected to each other, by the hinge, at their open ends. Preferably therein, the closed ends of the cup elements are not directly connected to each other. Further therein, preferably, the closed ends of the cup elements are pressed towards each other so as to insert the slotfiller into the open slot.

In another advantageous embodiment, the hinge connects the closed ends of the cup elements. In other words, the cup elements of the slotfiller are connected to each other, by the hinge, at their closed ends. Preferably therein, the open ends of the cup elements are not directly connected to each other. Further therein, preferably, the open ends of the cup elements are pressed towards each other so as to insert the slotfiller into the open slot.

Preferably, in the case that the hinge connects the closed ends of the cup elements, the slotfiller comprises a slit which extends along an extension direction of the cup elements from their open ends to their closed ends. Thereby, the open ends of the cup elements are separated from each other.

Preferably, in both cases described, i.e. either the open ends or the closed ends of the cup elements being connected by the hinge, the slotfiller is configured so as to be inserted into the slot via its closed ends first. In other words, during insertion, the slotfiller is oriented along an insertion direction with the closed ends of the cup elements facing towards the open slot.

Further preferably, the closed ends of the cup elements are chamfered. In particular, the cup elements are chamfered towards each other so as to ergonomically receive the user's fingers. Advantageously, the term "chamfered towards each other" means that, as opposed to a for example rectangular non-chamfered shape, the cup elements are chamfered (i.e. rounded off) such that their width decreases along their extension direction. The sides which are chamfered are preferably those sides of the cup elements not facing each other. Thereby, the width of each cup element decreases, along the cup element's extension direction, towards the other cup element, thereby being "chamfered towards each other".

Due to the preferably chamfered cup elements, the slotfiller may be inserted into the empty slot without the use of a user's direct press force via his/her fingers for pressing the cup elements together. In other words, the user can thereby substantially only press the slotfiller in the insertion direction. This force along the insertion direction presses the cup elements together via the chamfered surfaces of the cup elements pressing and sliding against sides of the open slot. Once fully inserted, the cup elements and the slotfiller preferably snap into place.

Thus, preferably, the cup elements may be pressed together directly, i.e. via a direct pressing force (squeezing) from a user's inserted fingers, or indirectly, i.e. via indirect pressing force resulting from a user's pressing force along the insertion direction.

Advantageously, especially in one and/or both aforementioned cases, sides of the cup elements which respectively face the at least one other cup element at least partially comprise a semi-circular shape respectively configured to ergonomically receive the finger of the user. Preferably, the aforementioned surfaces are semi-circular as seen from a view along the longitudinal extension direction of the cup elements.

Further advantageously, the aforementioned sides of the cup elements comprise a substantially S-shape or a double-S-shape.

Preferably, at least one inside surface of the cup elements, especially an inner surface of the aforementioned semi-circular surface, is corrugated. Thereby, the user can more reliably grip the slotfiller.

In an advantageous embodiment, outer surfaces of the cup elements comprise at least one fastening element respectively configured to latch with a recess of the component.

Preferably, the at least one fastening element of the cup elements is a latching nose which latches into a recess or cutout of the component.

In a further advantageous embodiment, the at least one fastening element of the cup elements is a recess or cutout into which a latching nose of the component latches.

Preferably, the hinge is a flexible single piece element. Further preferably, the hinge comprises a flexible and elastic material. The hinge is preferably a flat plate-shaped member attached to or formed integrally with the cup elements.

In an advantageous embodiment, the at least two cup elements and the hinge are integrally formed. The at least two cup elements and the hinge are especially formed of a single injection moulded or 3D-printed piece.

Further preferably, the slotfiller does not comprise any undercuts. In particular, the slotfiller is preferably moldable by a single pull molding process. Thereby, an injection mold tooling preferably does not need any sliders.

In an advantageous embodiment, the hinge comprises a recessed surface configured to receive a label for labelling the slotfiller. The recessed surface is preferably rectangular or round. The label is preferably a bar-code, a QR-code, or an RFID-tag.

Preferably, the slotfiller is axial symmetric. In other words, the slotfiller is preferably symmetric with respect to an axis, extending parallel to the extension direction of the cup elements and extending through a center of the slotfiller.

The present disclosure further concerns a computer-rack-insertable component. The component comprises at least one slot for receiving a sub-component and at least one slotfiller according to any one of the foregoing examples respectively inserted into one of the at least one slot.

One example of such a computer-rack-insertable component is a power distribution unit. Therein, for example, the sub-component is a power supply unit.

Further examples of computer-rack-insertable components may be server components comprising one or more computing units and/or networking units and/or cooling units, which are preferably sub-components selectively replaced by the slotfiller.

The present disclosure further concerns a computer rack. The computer rack comprises at least one computer-rack insertable component, wherein at least one of these is especially a power distribution unit with at least one slot for receiving a sub-component, for example a power supply unit. Further, the computer rack, in particular the computer-rack insertable component(s), comprises at least one slotfiller according to the foregoing examples respectively inserted into the at least one slot.

Preferably, the at least one computer-rack insertable component fills the computer rack such that, along the insertion direction of the component(s), a front side and a rear side of the computer rack are, with the exception of the slot in a pre-inserted state of the slotfiller, substantially closed off by the at least one component. In other words, if the one or all computer-rack insertable components are completely filled with sub-components and/or slotfillers, the front side and the rear side of the computer rack are preferably closed off at the at least one computer-rack insertable component. Therein, the slotfiller closes the slot in the inserted state so as to hinder heated air from circulating between the front side and the rear side of the computer rack. In particular, the slotfiller hinders heated air from circulating from the rear side to the front side of the computer rack.

In the foregoing examples, the dimensions of the slotfiller preferably correspond to the dimensions of the sub-component, especially to the dimensions of the power supply unit, it is intended to replace.

In particular, in one example, a width of the slotfiller horizontal perpendicular to the extension direction of the cup elements is preferably between and including 40 mm and 150 mm, preferably 50 mm and 90 mm, further preferably 60 and 80 mm, further preferably 65 mm and 75 mm. Most preferably, the width of the slotfiller is any one of the aforementioned values or 73.2 mm. Further preferably, a height of the slotfiller perpendicular to the extension direction and perpendicular to the width is between and including 20 mm and 60 mm, preferably 30 and 50 mm, further preferably 35 mm and 45 mm. Most preferably, the height of the slotfiller is any one of the aforementioned values or 42.2 mm.

In the foregoing examples, a material of the slotfiller is preferably a thermoplastic. In particular, the slotfiller preferably comprises PA66 material. In addition or alternatively thereto, the slotfiller preferably comprises Ultramid® C3U by BASF.

Preferably, a compression force necessary for suitably pressing the cup elements towards each other, either directly via the user's fingers or indirectly via the chamfered surfaces described above, is roughly 2 N to 10 N, preferably 4 N to 7 N, further preferably 4.2 N, at an ambient temperature of roughly 23° C.

BRIEF DESCRIPTION OF DRAWINGS

Further details, advantages, and features of the preferred embodiments of the present disclosure are described in detail with reference to the FIGs. Therein.

DESCRIPTION OF EMBODIMENTS

Figure 1:
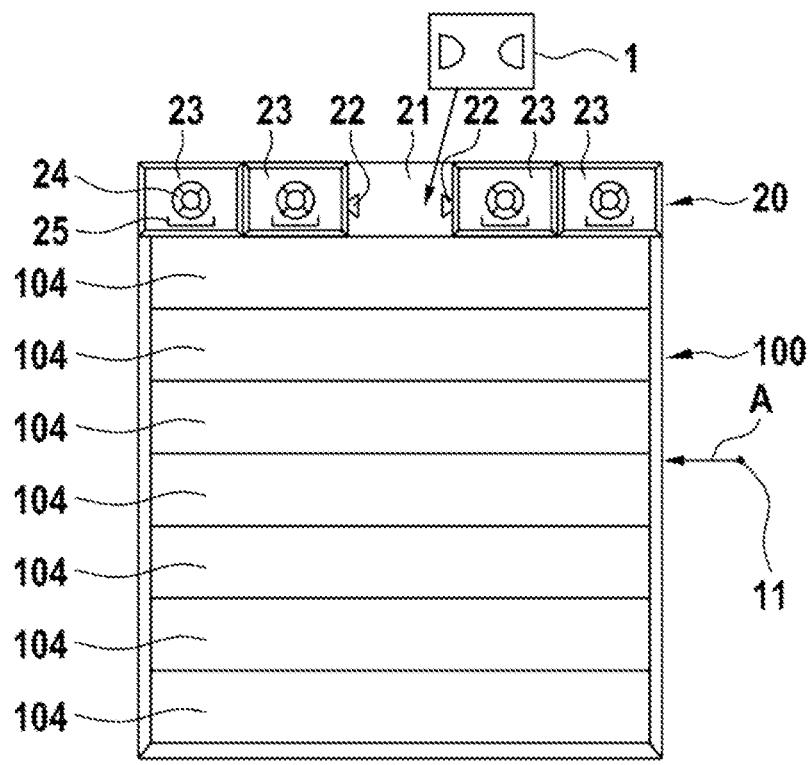
FIG. 1 shows a schematic front view of a computer rack, a computer-rack-insertable component, and a slotfiller according to a first embodiment of the present disclosure.
Figure 2:
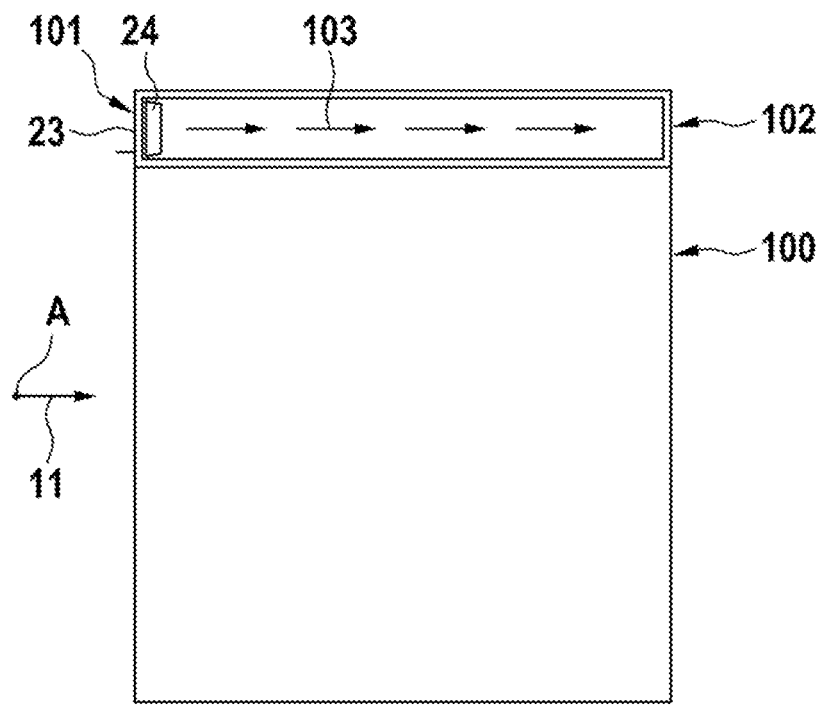
FIG. 2 shows a schematic cut-out side view of the computer rack, the computer-rack-insertable component, and the slotfiller according to the first embodiment of the present disclosure along the direction "A" of FIG. 1.

FIG. 1 shows a schematic front view of a computer rack 100, a computer-rack-insertable component 20, and a slotfiller 1 according to a first embodiment of the present disclosure. FIG. 2 shows a schematic cut-out side view of the computer rack 100, the computer-rack-insertable component 20, and the slotfiller 1 according to the first embodiment of the present disclosure along the direction "A" of FIG. 1. In FIG. 2, a sidewall of the computer rack 100 has been omitted for ease of explanation.

First, FIGS. 1 and 2 will be described so as to convey the use and function of the slotfiller 1.

As can be taken from FIG. 1, the computer rack 100 is essentially a frame or cabinet with a plurality of shelves 104. Computer-rack-insertable components 20 are inserted along an insertion direction 11 into the computer rack shelves 104. Such components 20 comprise for example computing units and/or memory units and/or networking units. In the examples described herein, the shown component 20 is a power distribution unit, which distributes electrical power to other components (not shown) in the computer rack 100. For the purpose of advantageously disposing of excess heat generated by the power distribution unit, said component 20 is provided in the top shelf 104 of the computer rack 100.

The component 20 comprises a plurality of slots 21, into each of which a sub-component 23, in this case a power supply unit, is inserted along the insertion direction 11. The sub-components 23 are held by a user using the handles 25 during insertion or removal thereof.

These sub-components 23 comprise one or more fans 24, especially at a front side 101 of the computer rack 100 or of the component 20, which transport air 103 (see: FIG. 2) from the front side 101 to the rear side 102 of the computer rack 100. The hot air 103 is usually expelled from the rear side 102 of the computer rack 100.

In the case shown in FIG. 1, one sub-component 23 is missing, i.e. has been taken out of the component 20. Thereby, the front side 101 of the computer rack 100 is not closed off entirely by the totality of sub-components 23. The sub-component 23 is, for instance, taken out during maintenance thereof. On the other hand, the user may take the sub-component 23 out of the component 20 when the sub-component 23 is not needed.

As is apparent from a comparison between FIGS. 1 and 2, the air 103, which is heated by elements such as transistors of the sub-component 23, usually flows from the front side 101 to the rear side 102 of the computer rack 100, thereby cooling the elements. The flow of hot air 103 causes an area of high air pressure to be generated at the rear side 102, and an area of low air pressure to be generated at the front side. Thereby, when a sub-component 23 is missing, the hot air 103 of the remaining sub-components 23 or of the other components 20 (not shown) can re-circulate via the open slot 21, in which no sub-component 23 is inserted. Thus, when a sub-component 23 is removed from the component 20 while said component 20, especially the remaining sub-components 23, is in use, hot air 103 travels from the rear side 102 to the front side 101 of the computer rack 100 and is sucked in by the fans 24 of the remaining sub-components 23, especially of the adjacent sub-components 23. Thereby, an effective cooling of the remaining sub-components 23 is hindered, which can lead to failure of these.

Thus, in the present disclosure, the slotfiller 1, which will be described in more detail below, is inserted into the empty slot 21 shown in FIG. 1. The slotfiller 1 thereby hinders air flow 103 from re-circulating by closing off the front side 101 of the computer rack 100.

In the following, the slotfiller 1 will be described in more detail.

Figure 3:
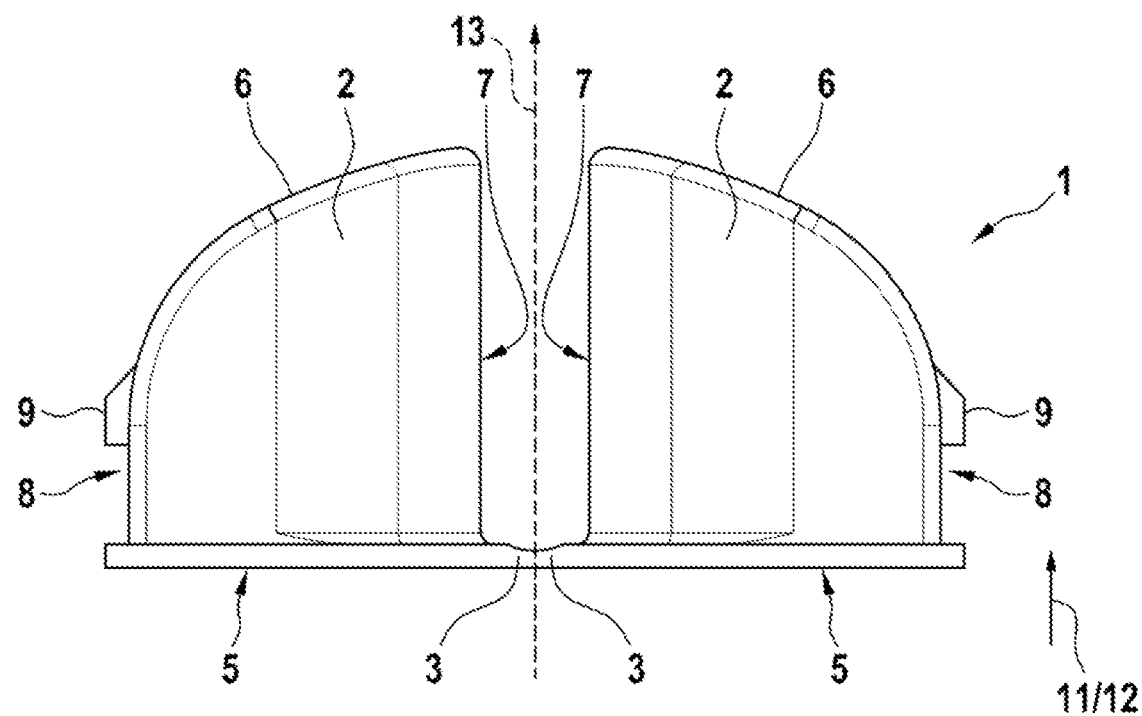
FIG. 3 shows a plan view of the slotfiller according to the first embodiment of the present disclosure.
Figure 4:
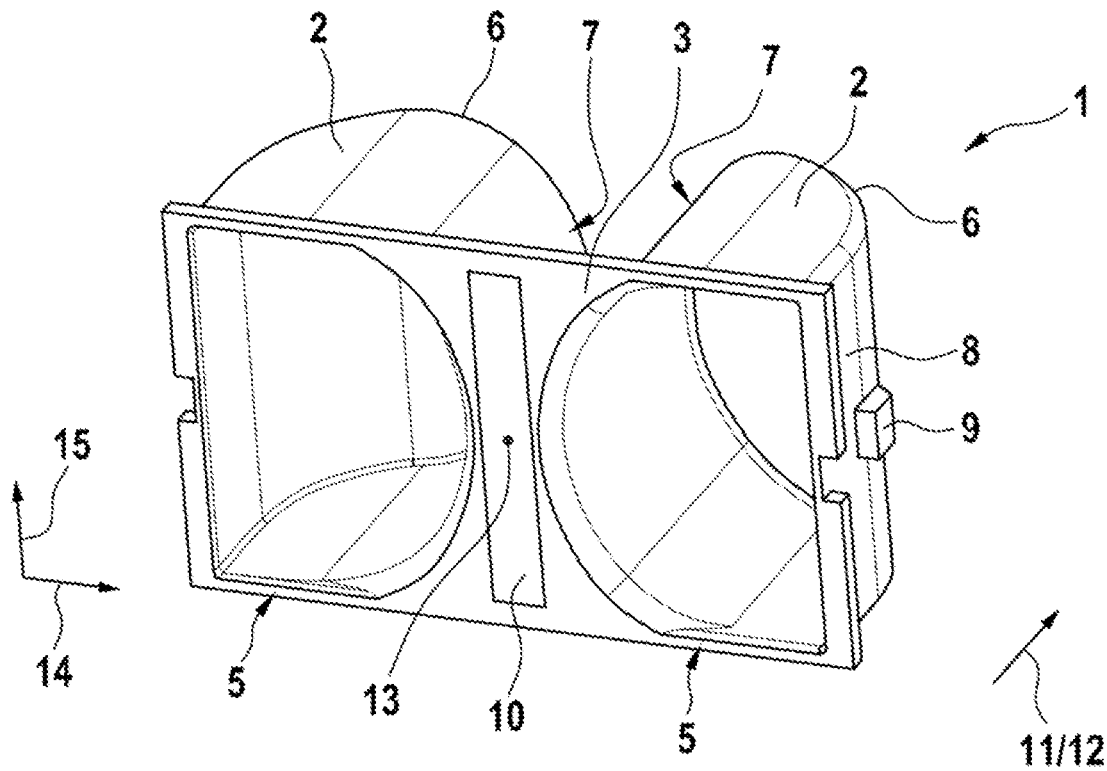
FIG. 4 shows a perspective view of the slotfiller according to the first embodiment of the present disclosure.

FIG. 3 shows a plan view of the slotfiller 1 according to the first embodiment of the present disclosure, whereas FIG. 4 shows a perspective view of the slotfiller 1 according to the first embodiment of the present disclosure.

Figure 7:
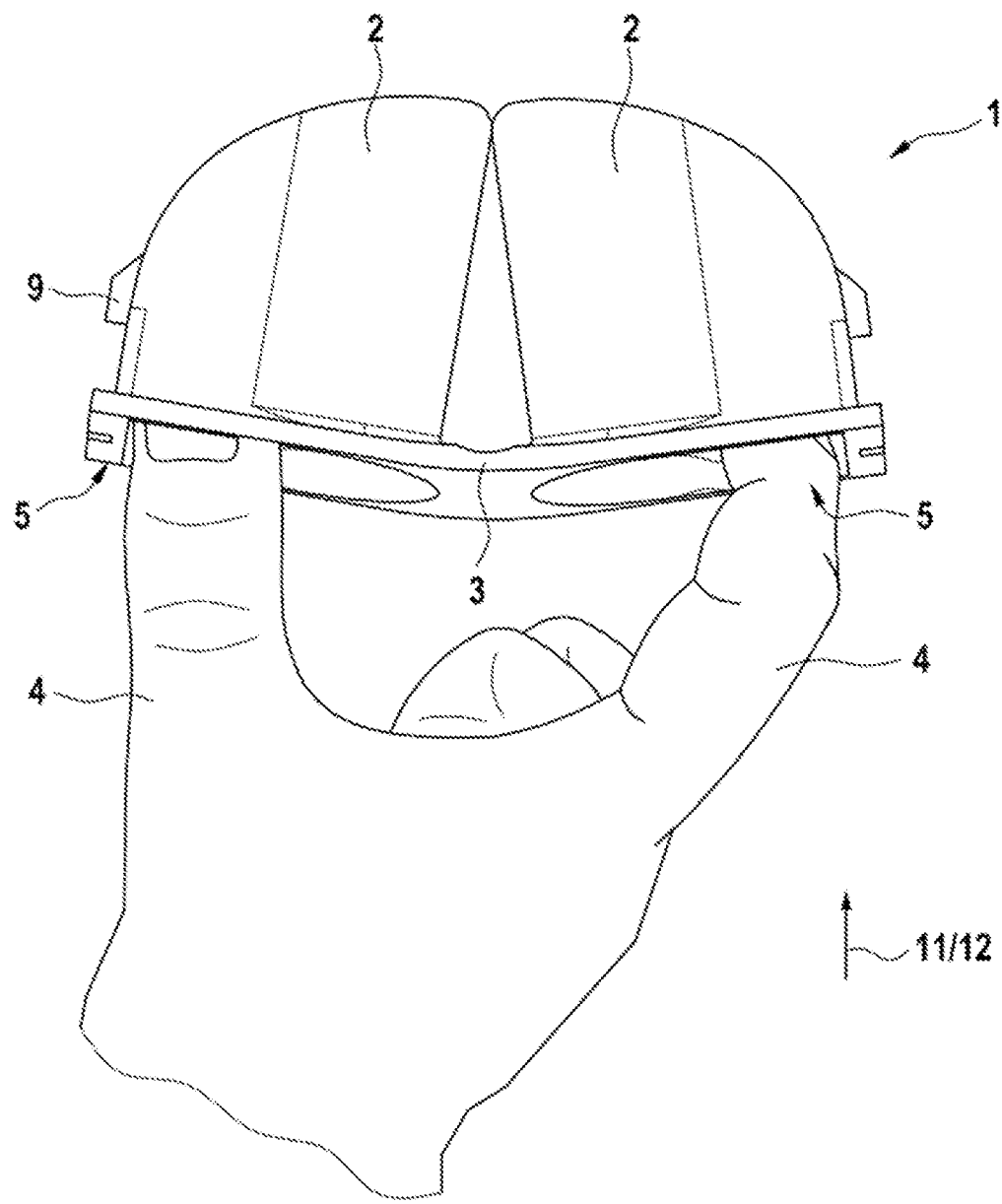
FIG. 7 shows a plan view of the slotfiller according to the foregoing embodiments in a pressed state.

The slotfiller 1 comprises two cup elements 2, which are each configured to at least partially accommodate at least one finger of a user (see also: FIG. 7).

The two cup elements 2 each have an open end 5 and a closed end 6, wherein the inserted finger of the user abuts against the closed end 6 when fully inserted, depending of course on a length of the finger.

Further, the slotfiller 1 comprises a hinge 3 which connects the cup elements 2. Herein, the hinge 3 connects the open ends 5 of the cup elements 2. The hinge 3 can also be described as a plate-shaped member extending across the cup elements 2.

Further, sides 7 of the cup elements 2, which respectively face each other, comprise a semi-circular shape so as to ergonomically receive the finger of the user.

In addition, the closed ends 6 of the cup elements 2 are chamfered. In the present case, the closed ends 6 are chamfered towards each other, i.e. towards the other cup element 2. As can be taken from FIGS. 3 and 4, "chamfered towards each other" means that (as opposed to rectangular shapes) the cup elements 2 are rounded off towards each other. In other words, outer surfaces 8 of the cup elements 2 not facing each other are chamfered or rounded off such that a width of each cup element 2 decreases along its longitudinal extension 12.

Thereby, when inserting the slotfiller 1 into the empty slot 21, the user does not necessarily have to directly press or squeeze the cup elements 2 together. Instead, the chamfered shape of the cup elements 2 causes these to be pressed together when being pressed into the slot 21 by sliding along an inner surface of the slot 21. Thus, the cup elements 2 are pressed together via the insertion force. In particular, this may be referred to as "indirectly pressed together".

The slotfiller 1 is formed of a single piece. In other words, the cup elements 2 and the hinge 3 are formed integrally with one another. Portions of the cup elements 2 apart from the portions (the open ends 5) which are not connected by the hinge 3, are not connected directly to one another. As can be taken from FIGS. 3 and 4, the slotfiller 1 does not comprise any undercuts. Thereby, the slotfiller 1 can be easily manufactured using, for example, single pull injection molding.

In particular, the slotfiller 1 is formed of a thermoplastic having elasticity. Thereby, the user can insert his finger(s) into the cup elements 2 and press the cup elements 2 towards each other (either directly or indirectly), thereby bending the hinge 3. In the case of direct pressing, the user can then insert the slotfiller 1 in this pressed state into the empty slot 21 of the component 20 along the insertion direction 11.

Once letting go of the inserted slotfiller 1, i.e. reducing the pressing force which presses the cup elements 2 together, the elastic hinge 3 causes the slotfiller 1 to expand into its original state (shown in FIGS. 3 and 4) in order to fill the empty slot 21. The slotfiller 1 may be removed from the component 20 by again compressing it via pressing force for pressing the cup elements 2 towards each other, and pulling the slotfiller 1 out of the (then) empty slot 21.

Further, the outer surfaces 8 of the cup elements 2 each comprise a latching nose 9 as a fastening element, which is a hook-like element, and which latches into a recess 22 provided in the component 20 (see FIG. 1) once the slotfiller 1 has been inserted and de-compressed. The sub-components 23 preferably comprise a latching nose (not shown) which corresponds in shape to the latching nose 9 of the slotfiller 1. In other words, the latching nose 9 of the slotfiller 1 is configured so as to correspond to a latching nose of the sub-component 23 it is intended to replace, thereby allowing the slotfiller 1 to be easily accommodated by the component 20.

In addition, the hinge 3 comprises a recessed surface 10 which is recessed towards an extension direction 12 of the cup elements 2. The extension direction 12 of the cup elements 2 is, during insertion of the slotfiller 1, co-axial with the insertion direction 11. The recessed surface 10 is configured to receive a label, for example a sticker, for labelling the slotfiller 1.

As is further apparent from FIGS. 3 and 4, the slotfiller 1 is axial symmetric. In other words, the slotfiller 1 is symmetric with respect to a center axis 13 in width 14 and height 15 directions.

Essentially, the width 14 and the height 15 of the slotfiller 1 correspond to the width and the height of the sub-component 23 which it replaces. In the present example, the slotfiller 1 has a width 73.2 mm and a height of 42.2 mm.

Further, at an area surrounding the center axis 13, the hinge may comprise a reduced thickness so as to allow easier bending thereof, as is shown in FIG. 3.

Figure 5:
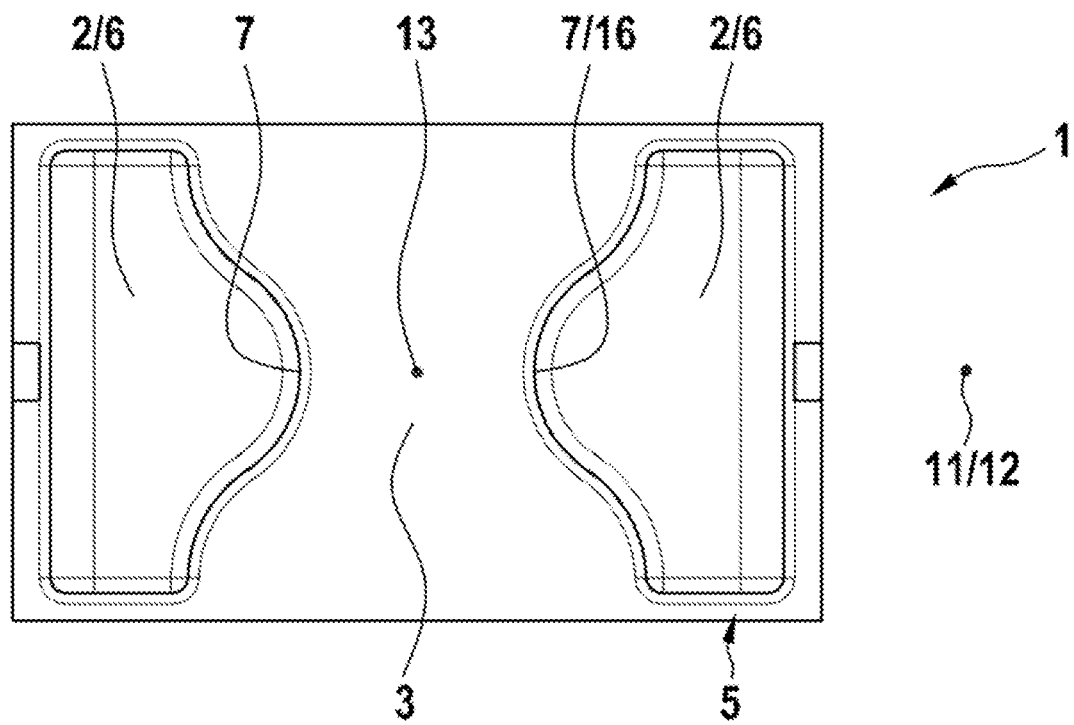
FIG. 5 shows a front view of a slotfiller according to a second embodiment of the present disclosure.
Figure 6:
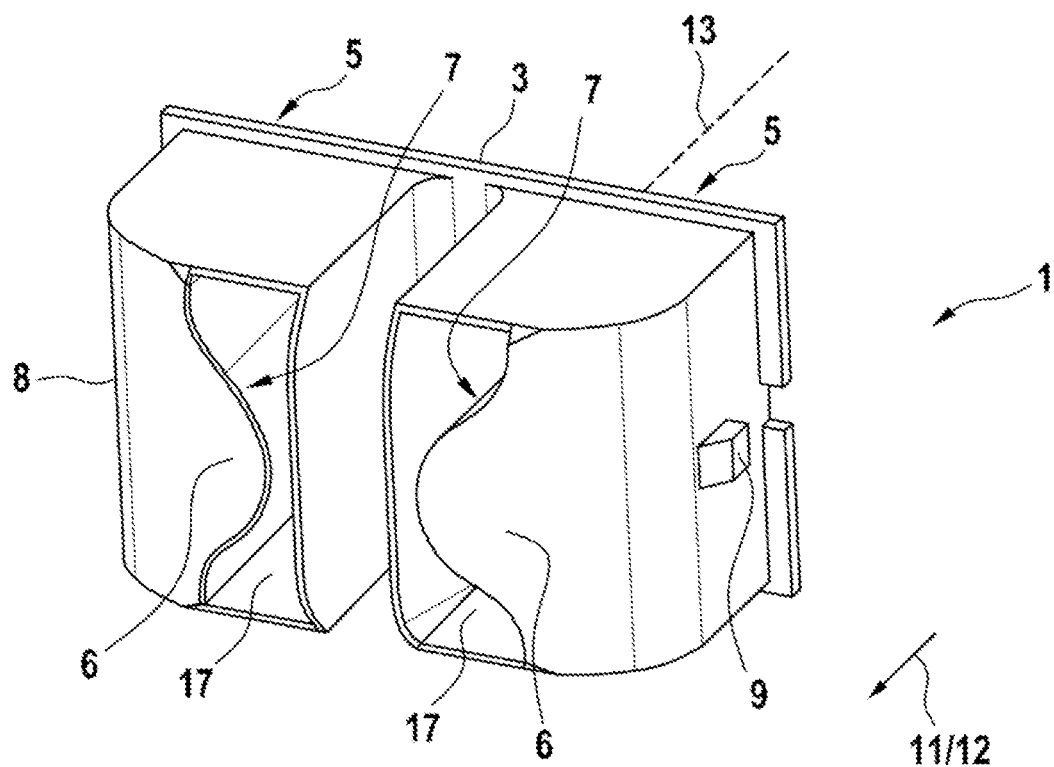
FIG. 6 shows a perspective view of the slotfiller according to the second embodiment of the present disclosure.

FIG. 5 shows a front view of a slotfiller 1 according to a second embodiment of the present disclosure, whereas FIG. 6 shows a perspective view of the slotfiller 1 according to the second embodiment of the present disclosure.

As can be taken from FIGS. 5 and 6, the slotfiller 1 according to the second embodiment comprises an inner surface 16 which is substantially S-shaped. In other words, sides 7 of the cup elements 2 facing each other are S-shaped.

As be taken especially from FIG. 6, the sides 7 of the cup elements 2 directly facing each other are flat. A hollow portion 17 separates the sides 7 of the cup elements 2 directly facing each other from the sides 7 comprising the S-shaped inner surfaces 16 of the cup elements 2 further on the inside thereof with respect to the other cup element 2.

Of course, the first and second embodiments with respect to the sides 7 may be combined. In other words, the sides 7 of the cup elements 2 directly facing each other shown in FIGS. 3 and 4 may also comprise the S-shape shown in FIGS. 5 and 6, especially without the hollow portion 17.

FIG. 7 shows a plan view of the slotfiller 1 according to the foregoing embodiments in a pressed state. In particular, the plan view is along a direction perpendicular to the insertion direction 11 or the extension direction 12 of the cup elements 2.

As can be taken from FIG. 7, the slotfiller 1 can be easily compressed by a user. Therein, the user inserts his fingers 4 into the open ends 5 of the cup elements 2 and presses the cup elements 2 together. Thereby, the hinge 3 of the slotfiller 1 is bent and the slotfiller 1 thereby compressed, allowing for insertion into the empty slot 21 of the component 20.

Once letting go of the slotfiller 1, i.e. removing the fingers 4 of the user, the slotfiller 1 returns elastically back to the original state shown in FIGS. 3 to 6.

Figure 8:
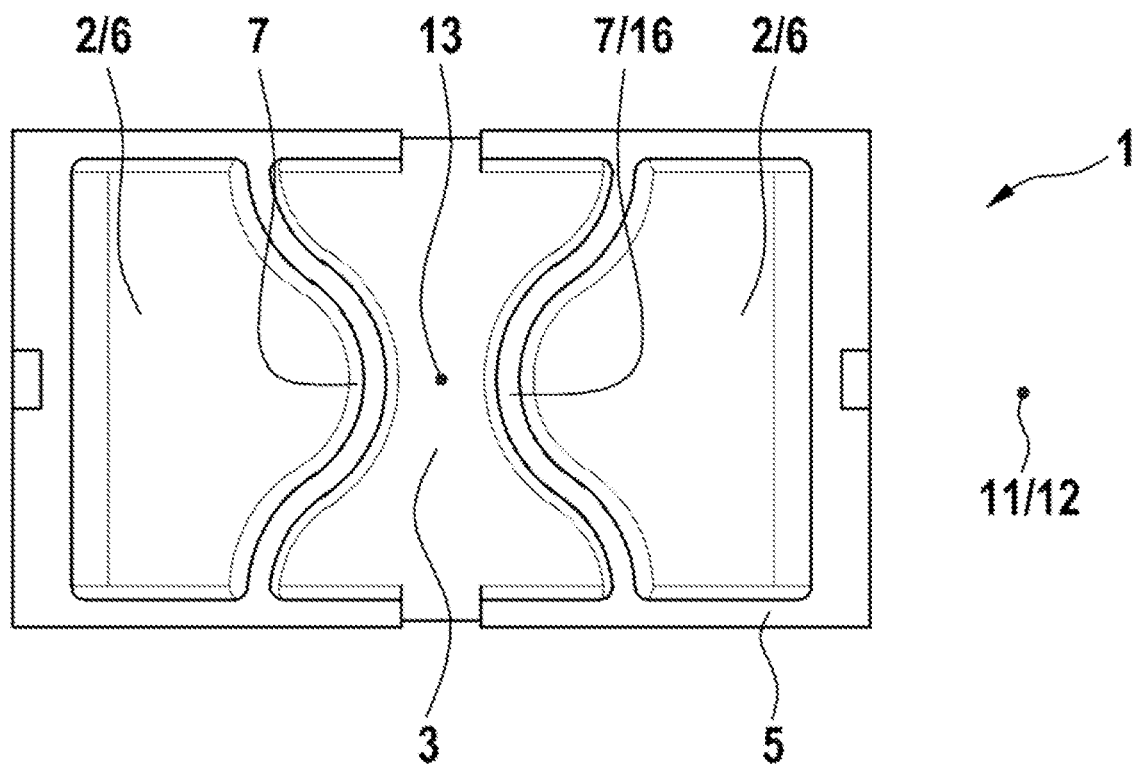
FIG. 8 shows a front view of a slotfiller according to a third embodiment of the present disclosure.
Figure 9:
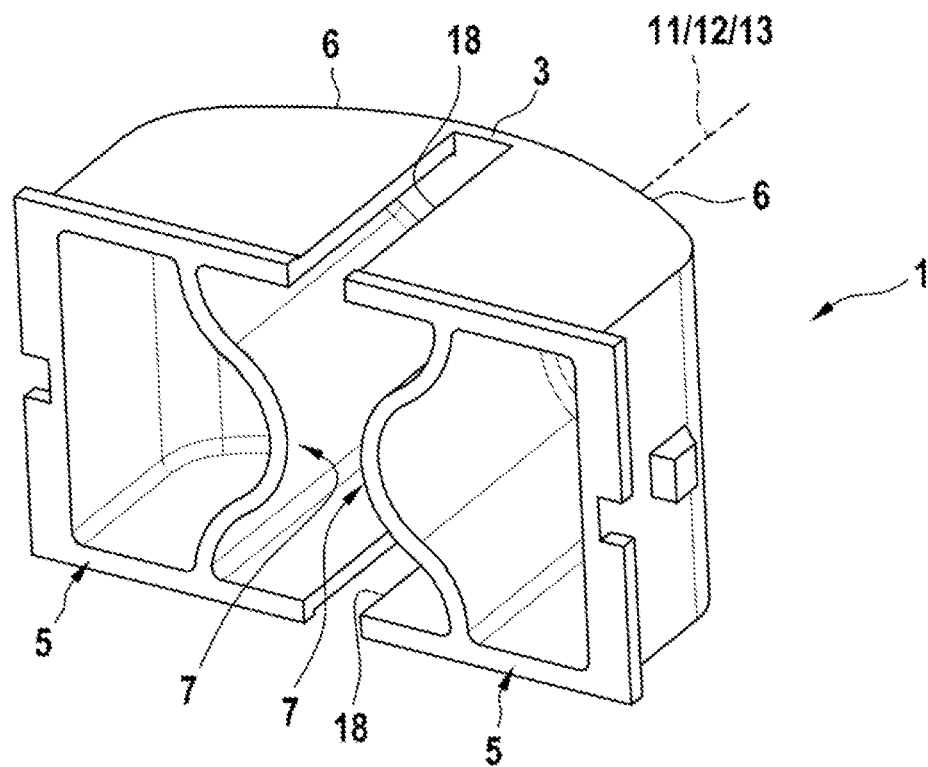
FIG. 9 shows a perspective view of the slotfiller according to the third embodiment of the present disclosure.

FIG. 8 shows a front view of a slotfiller 1 according to a third embodiment of the present disclosure, whereas FIG. 9 shows a perspective view of the slotfiller 1 according to the third embodiment of the present disclosure.

In the present embodiment, the hinge 3 connects the closed ends 6 of the cup elements 2.

Herein, for compressing the slotfiller 1, the user inserts his/her fingers into the open ends 5 of the cup elements 2 and presses the cup elements 2 towards each other. In this case, the user presses the open ends 5 of the cup elements 2 towards each other, thereby bending the hinge 3.

In addition, the slotfiller 1 comprises slits 18 so as to allow the slotfiller 1 to be elastically compressed and de-compressed, i.e. to allow the hinge 3 to be bent without the cup elements 2 interfering the bending process.

Then, once pressing the open ends 5 towards each other, the slotfiller 1 is inserted, along the insertion direction 11 or the extension direction 12 of the cup elements 2 into the empty slot 21, as described above.

To allow for an advantageously ergonomic gripping of the slotfiller 1, the sides 7 of the cup elements 2 directly facing each other are formed in an S-shape.

In all foregoing described embodiments, the inside surfaces 16 of the cup elements 2 may be corrugated, so as to hinder slipping of the user's fingers 4 from the inside of the cup elements 2.

Any one of the slotfillers 1 of the foregoing described embodiments one to three (FIGS. 3, 5, and 8) may be used to close off the empty slot 21 of the component 20 of the computer rack 100 of the present disclosure.

As shown in FIG. 1, the present disclosure also encompasses the computer rack 100 and the computer-rack-insertable component 20, into which at least one of the slotfillers 1 described in the foregoing are inserted.

The slotfillers 1 according to the foregoing described embodiments may be suitably combined with one another. For instance, the slotfillers 1 shown in FIGS. 3 and 5, especially concerning their shapes of sides 7 or inner surfaces 16, may be connected by a hinge 3 connecting their closed ends 6, instead of their open ends 5. Further advantageously, the slotfiller 1 of the third embodiment shown in FIG. 8 may comprise the same shape of sides 7 or inner surfaces 16 as those of embodiments one and two shown in FIGS. 3 and 5. Further, any one of the aforementioned embodiments may have the hinge 3 at the open ends 5 or at the closed ends 6.

All foregoing described embodiments of slotfillers 1 can be suitably inserted into the component 20 of the computer rack 100. Further, different embodiments of the slotfillers 1 may be inserted into different empty slots 21, either of the same component 20, or of separate components 20 inserted in the computer rack 100.

In addition to the foregoing written explanation of the disclosure, it is explicitly referred to FIGS. 1 to 9, which in detail show features of the disclosure.

What is claimed is:

1. A slotfiller for closing a slot in a computer-rack-insertable component, comprising:
    at least two finger-grippable cup elements; and
    a hinge connecting the two cup elements;
    wherein the slotfiller is made of elastic material and is elastically insertable into and removable out from the slot by pressing of the cup elements towards each other and at least partially cover an open surface area of the slot by releasing of the cup elements in the inserted state;
    wherein outer surfaces of the cup elements comprise at least one fastening element respectively configured to latch with a recess or cutout of the computer-rack-insertable component;
    wherein the at least one fastening element of the cup elements is a latching nose;
    each of the cup elements comprises an open end, and a closed end opposite to the open end;
    the outer surface of each of the cup elements comprises a substantially straight portion extending from the open end, and a curved portion extending from the straight portion and forming the closed end; and
    the latching nose is formed on the straight portion and protrudes perpendicularly from the straight portion.

2. The slotfiller according to claim 1, wherein each of the cup elements is configured to at least partially accommodate at least one finger of a user.

3. The slotfiller according to claim 2, wherein the open end of each of the cup elements is for receiving the finger of the user and the closed end of each of the cup elements is which the inserted finger of the user abuts against.

4. The slotfiller according to claim 3, wherein the slotfiller is oriented along an insertion direction with the closed ends of the cup elements facing towards an opening of the slot.

5. The slotfiller according to claim 3, wherein the hinge connects the open ends of the cup elements or connects the closed ends of the cup elements.

6. The slotfiller according to claim 5, wherein the cup elements are pressed together directly via a direct pressing force from the user's inserted fingers in response to the cup elements are connected by the hinge at the open ends.

7. The slotfiller according to claim 5, wherein the cup elements are pressed together indirectly via indirect pressing force resulting from the user's pressing force along an insertion direction in response to the cup elements are connected by the hinge at the closed ends.

8. The slotfiller according to claim 1, wherein sides of the cup elements which respectively face the at least one other cup element at least partially comprise a semi-circular shape respectively configured to ergonomically receive the finger of the user.

9. The slotfiller according to claim 1, wherein the hinge is a flexible single piece element.

10. The slotfiller according to claim 1, wherein the at least two cup elements and the hinge are integrally formed of a single injection moulded or 3D-printed piece.

11. The slotfiller according to claim 1, wherein the slotfiller does not comprise any undercuts.

12. The slotfiller according to claim 1, wherein the hinge comprises a recessed surface configured to receive a label for labelling the slotfiller.

13. The slotfiller according to claim 1, wherein the slotfiller is axial symmetric with respect to an axis extending parallel to an extension direction of the cup elements and extending through a center of the slotfiller.

14. The slotfiller according to claim 1, the dimensions of the slotfiller correspond to the dimensions of a sub-component which the slotfiller is intended to replace.

15. A computer-rack-insertable component, comprising at least one slot for receiving a sub-component and at least one slotfiller according to claim 1 respectively inserted into the at least one slot.

16. The computer-rack-insertable component according to claim 15, wherein the computer-rack-insertable component is a power distribution unit and the sub-component is a power supply unit.

17. A computer rack comprising at least one computer-rack insertable component, at least one of which being a power distribution unit, with at least one slot for receiving a power supply unit, and at least one slotfiller according to claim 1 respectively inserted into the at least one slot.

18. The computer rack according to claim 17, wherein the at least one computer-rack insertable component fills the computer rack such that, along an insertion direction of the component(s), a front side and a rear side of the computer rack are, with the exception of the slot in a pre-inserted state of the slotfiller, substantially closed off by the at least one component, and wherein the slotfiller closes the slot in the inserted state so as to hinder heated air from circulating between the front side and the rear side of the computer rack.

19. The slotfiller according to claim 1, wherein for each of the cup elements, when viewed in a direction perpendicular to an extension direction of the cup element, the extension direction extending from the open end to the closed end of the cup element, the latching nose has a trapezoidal shape.

20. The slotfiller according to claim 19, wherein one of two parallel sides of the latching nose lies on the straight portion of the outer surface of the cup element.

* * * * *